United States Patent [19]

Plaige

[11] 4,205,240
[45] May 27, 1980

[54] DEVICE FOR PROGRESSIVE ELECTRICAL SWITCHING

[75] Inventor: Yves Plaige, Bures-sur-Yvette, France

[73] Assignee: Commissariat a l'Energie Atomique, Paris, France

[21] Appl. No.: 840,527

[22] Filed: Oct. 11, 1977

[30] Foreign Application Priority Data

Oct. 15, 1976 [FR] France .................. 76 31061

[51] Int. Cl.² .................................. H03K 17/00
[52] U.S. Cl. ............................ 307/350; 307/251; 307/243; 328/104
[58] Field of Search ........... 307/251, 243, 216, 350, 307/262; 328/104, 133

[56] References Cited

U.S. PATENT DOCUMENTS 3,854,117 12/1974 Fothergill ................... 328/133
4,010,385 3/1977 Krol ....................... 307/243

Primary Examiner—Stanley D. Miller, Jr.
Assistant Examiner—B. P. Davis

[57] ABSTRACT

The switching device delivers an electrical output signal having a mean amplitude which changes progressively from the amplitude of a first signal to that of a second signal. One control signal produced by a logical unit is applied to each control input of a switching unit for closing or opening the switches of the switching unit. The control signal is given a first logical level during a first period and a second logical level during a second period. During an intermediate "switching" period the signal is given alternately the first logical level and the second logical level with a predetermined frequency. The time-duration of the half-waves of the first logical level thus decreases progressively when passing from the first period to the second period.

4 Claims, 3 Drawing Figures

DEVICE FOR PROGRESSIVE ELECTRICAL SWITCHING

This invention relates to a device for progressive electrical switching.

In more exact terms, the present invention relates to an electric circuit having two input terminals to which two electrical signals can be applied and one output terminal. The switching circuit makes it possible to obtain an intermediate "progressive switching" period between a first period in which the first input is continuously connected to the output and a second period in which the second input is continuously connected to the output. In other words, the first electrical signal and then the second electrical signal are continuously present at the output of the device in the two end periods. During the progressive switching period, switching takes place at a predetermined frequency but during variable time intervals which connects each input to the output in alternate sequence. These variable switching times are controlled so as to obtain on an average a uniform and progressive transition from the first signal to the second signal.

In a certain number of existing installations, it is in fact already possible to utilize different signals for carrying out successive measurements of a given parameter by means of a single measuring instrument. However, in the case of certain measuring instruments, the abrupt transition from the first signal to the second signal causes disturbances in this measurement. It is therefore necessary to have a progressive transition from the first signal to the second signal. This is the case, for example, when it is desired to measure neutron flux in a nuclear reactor. There is produced on the one hand an electrical signal $I_1$ representing the count rate delivered by a fission chamber and on the other hand an electrical signal $I_2$ which is representative of the neutron flux. The measurement is carried out first by making use of the signal $I_1$ and then by making use of the signal $I_2$, both of which drive a logarithmic amplifier. In accordance with the invention, the progressive transition is obtained by passing samples of two juxtaposed signals in a transitional period in such a manner as to ensure that in the course of time the first signal is dominant at the beginning of the transitional period and that the second signal is dominant at the end of said transitional period.

The present invention is precisely directed to a switching device which makes is possible to obtain the result just mentioned by simple and reliable means.

The progressive electrical switching device makes it possible to obtain at its output an electrical output signal having a mean amplitude which changes progressively from the amplitude of a first electrical signal to that of a second electrical signal. The device essentially comprises:

a switching unit constituted essentially by two first switches mounted in parallel, each switch being provided with one input, one output and one control input, one of the signals being applied to each input of the switches, the outputs of the switches being connected to a common output terminal of the device at which said electrical output signal is obtained, and a logical unit for controlling said switching unit in order to produce two logical control signals $S_1$ and $S_2$, one of said signals being applied to each control input of the switching unit, each signal being capable of assuming a first logical level for closing said first switches and a second logical level for opening said first switches, the two signals $S_1$ and $S_2$ being such as to have different logical levels at each instant, said control unit being provided with means for giving the first logical level to the signal $S_1$ during a first period and a second logical level to said signal during a second period and for giving to the same signal during an intermediate period or so-called "switching period" between the first and the second period alternately the first logical level and the second logical level with a predetermined frequency so as to ensure that the time-duration of the half-waves of the first logical level decreases progressively when passing from the first period to the second period.

Preferably, said logical control unit essentially comprises a double-threshold circuit for receiving one of the electrical signals on one of its inputs, an oscillator and a wave-shaping circuit, the output of said double-threshold circuit being connected to the input of said oscillator, said oscillator being capable of delivering square-topped voltage pulses of constant amplitude and of predetermined frequency and of variable width, said double-threshold circuit being such as to deliver a signal for blocking said oscillator in a first position if the signal applied to the input of the double-threshold circuit is lower than the bottom threshold, a signal for blocking said oscillator in a second position if the signal applied to the input of the double-threshold circuit is higher than the top threshold, and an oscillation signal which is proportional to the signal applied to said double-threshold circuit when said signal is between the two thresholds.

Preferably, the switching unit further comprises two second switches, each second switch being mounted between the input of one of the first switches and ground, each second switch aforesaid being controlled by the signal applied to the control input of the first switch associated with the other second switch.

A more complete understanding of the invention will in any case be gained from the following description of a preferred embodiment of the invention which is given by way of example and not in any limiting sense, reference being made to the accompanying drawings, wherein.

The progressive switching device essentially comprises a switching unit constituted by two controlled switches which each receive one of the two signals at their inputs and have a common output. The switches are operated in alternate sequence by means of a control unit which initiates opening and closure of the switches. It can readily be understood that, since the two switches are operated in alternate sequence, and if the time-duration of the periods of opening of one of the switches decreases to zero, there accordingly takes place a progressive transition of the first signal to the second signal at the output of the device.

Figure 1:
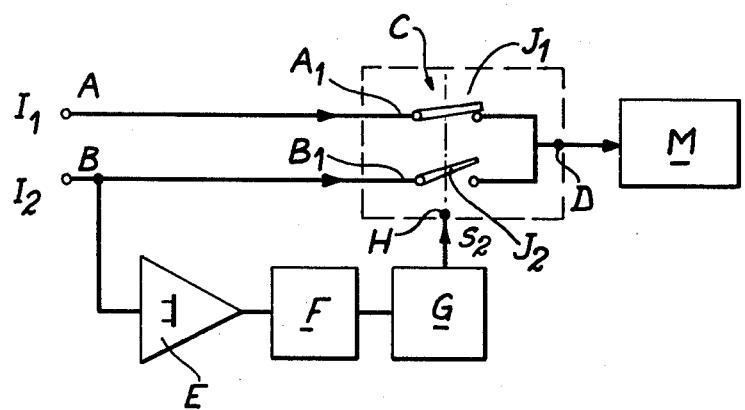
FIG. 1 is a simplified diagram showing the main elements of the device in accordance with the invention.

FIG. 1 is a simplified diagram of the device as a whole and shows two input terminals A and B to which two signals $I_1$ and $I_2$ are effectively applied. These two terminals are connected to the input terminals $B_1$ and $A_1$ of a switching unit C which essentially comprises two switches $J_1$ and $J_2$. The output of these two switches is connected to the common output terminal D of the device. The output D is connected to a measuring instrument designated by the reference M.

The input terminal B is also connected to the input of a double-threshold circuit E whose output is connected to the input of an oscillator F which is capable of delivering square-topped pulses having widths which are variable as a function of the control signal delivered by the device E. The output of the circuit F is connected to the input of a wave-shaping device G, the output of said device which delivers a signal $S_2$ being in turn connected to the control input H of the switching unit C. Said control input is capable of producing action alternately on the switches $J_1$ and $J_2$. The circuits E, F and G constitute the control unit.

Figure 2:
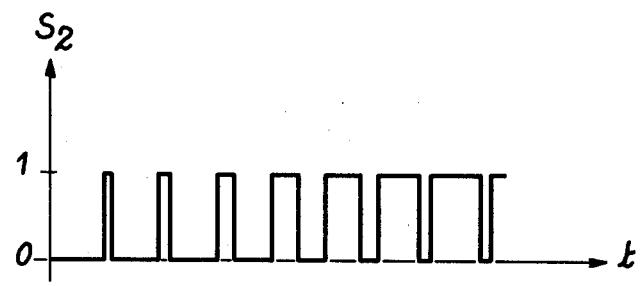
FIG. 2 is a time diagram representing the signal for controlling the switching unit.

The principle of operation of the device is as follows: when the signal $I_2$ has a low level, the circuit E blocks the oscillating circuit F in a state which initiates closure of the switch $J_1$ and opening of the switch $J_2$ (signal $S_2$ at the level 0). In consequence, only the signal $I_1$ is present at the output D of the switching unit C (this has been designated as the first period). When the signal $I_2$ exceeds a higher threshold defined by the unit E, the oscillating circuit F is blocked in a position such that the circuit G delivers a signal ($S_2$ at the logical level 1) which is applied to the terminal H, blocks the switch $J_2$ in the closed position and blocks the switch $J_1$ in the open position. In consequence and in respect of this period (which has been designated as the second period), only the signal $I_2$ is present at the output D. In the case of the values $I_2$ which are comprised between the two thresholds, the oscillating circuit delivers square-topped signals which decrease in width as the current $I_2$ increases. As can be seen from FIG. 2, the square-topped signals have an upper level and a lower level. The upper level initiates closure of the switch $J_2$ and opening of the switch $J_1$. On the contrary, the lower-level portions initiate closure of the switch $J_1$ and opening of the switch $J_2$. In consequence and as shown in FIG. 2, the switch $J_1$ at the outset is open during short time intervals whereas the switch $J_2$ is open during longer time intervals. The signal $I_1$ is therefore preponderant. Progressively as the signal $I_2$ increases, the opening time of the switch $J_1$ increases and the closure time of the switch $J_2$ also increases. In consequence, there is obtained at the output terminal D of the circuit C a signal which is constituted by samples of the signal $I_1$ and samples of the signal $I_2$ so that the signal $I_1$ is chiefly present at the beginning of this transitional period and a signal $I_2$ is chiefly present at the end of this period. In mean value, there therefore takes place a uniform and progressive transition between the signal $I_1$ and the signal $I_2$.

Figure 3:
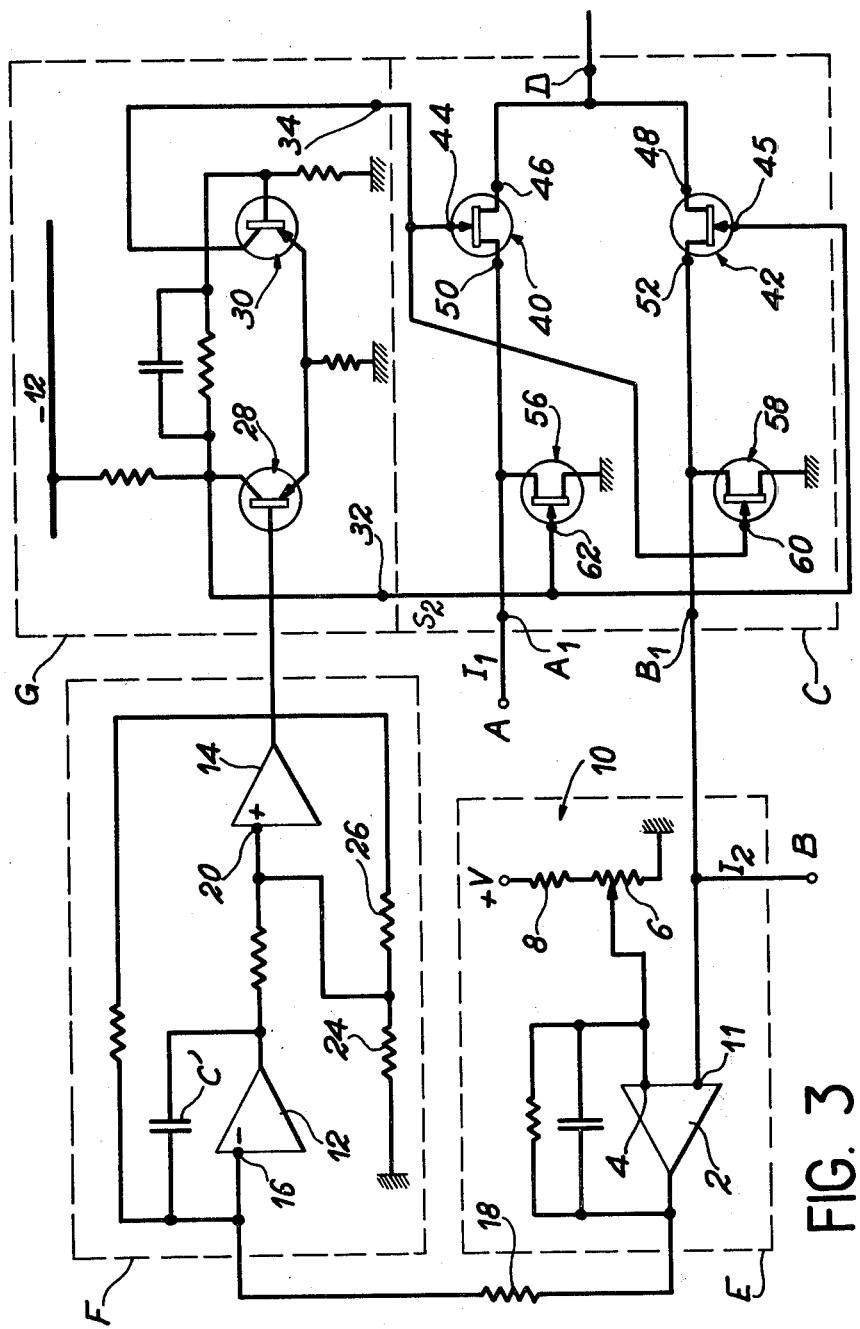
FIG. 3 is a more detailed diagram of one form of construction of the progressive switching device.

One embodiment of the invention is shown in detail in FIG. 3 in which the same general notations as those employed in FIG. 1 are again adopted. The constituent elements of each unit will accordingly be described.

The control device E which can first be seen in this figure is essentially constituted by an operational amplifier 2, the signal being applied to the input terminal B of said device. A reference voltage which is essentially generated by means of the potentiometer 6 and the resistance 8 associated with a voltage supply 10 is applied to the input 4 of the operational amplifier. As long as the signal $I_2$ (applied to the input 11) is lower than the reference voltage applied to the terminal 4 of the operational amplifier 2, this latter is saturated. Moreover, when the voltage applied to its differential input exceeds a threshold value of 12 volts, for example, the operational amplifier is again saturated.

The oscillator F is essentially constituted by the operational amplifiers 12 and 14. The reversing input 16 of the operational amplifier 12 is connected to the output of the amplifier 2. The amplifier 12 is mounted as an integrator with the capacitor C as negative feedback and the resistor 18. The output of the amplifier 12 drives the forward input 20 of the amplifier 14 through a resistor and the output of said amplifier 14 is connected as a feedback loop to the reversing input 16 of the amplifier 12. The amplifier 14 is mounted as a trigger-type threshold circuit, said threshold circuit being defined by the resistors 24 and 26. The operation of this circuit is in any case of conventional type and will be described below. The matching circuit G is in fact a Schmitt trigger of conventional type which is essentially constituted by the transistors 28 and 30. There are obtained at the outputs 32 and 34 of said matching circuit square-topped signals which represent complementary logical control levels (these outputs 32 and 34 constitute the control output H of FIG. 1).

As has already been mentioned, the switching unit C is essentially constituted by the switches $J_1$ and $J_2$, the outputs of which are connected to the output terminal D. The switches $J_1$ and $J_2$ are preferably constituted by field-effect transistors 40 and 42 (relays could also be employed). The input gates 44 and 45 of these transistors are connected respectively to the outputs 32 and 34 of the Schmitt trigger G and therefore constitute the control inputs of the switches. The source terminals 46 and 48 are connected to the common output of the device D whereas their drain terminals 50 and 52 are connected to the inputs of the switching unit $A_1$ and $B_1$. The signals $I_1$ and $I_2$ are applied to each input of the device. The switching unit further comprises the field-effect transistors 56 and 58 which serve to connect the inputs to ground when the corresponding switches are open. To this end, the gate 60 of the transistor 58 is also connected to the output 34 of the Schmitt trigger and the gate 62 of the transistor 56 is also connected to the output 32 of the Schmitt trigger. It is thus apparent that, when a signal $S_1$ ($S_1 = \bar{S}_2$) appears for example at the output 34 of the circuit G, the complementary signal $S_2$ appears at the output 32. In consequence, the transistor 42 is caused to cut-off and the same applies to the transistor 56 in contrast to the transistors 40 and 58 which are in the conducting state. The signal $I_1$ will therefore be again present at the output D whereas the signal $I_2$ is grounded.

The operation of the oscillator F which is of known type will now be briefly described. The amplifier 14 is normally saturated at a positive or negative level. The trip threshold is defined by the resistors 24 and 26 and this threshold is either positive or negative, depending on the polarity of the voltage at the output of said amplifier 14. If the output of said amplifier is positive, a current is directed towards the integrator which is essentially constituted by the amplifier 12, the output voltage of which decreases and becomes sufficiently negative to produce a reversal of the amplifier 14. The current directed to the integrator 12 is then reversed and the same applies to the output of said amplifier. There will be a further reversal when the positive trip threshold will have been reached. Under these conditions a symmetrical triangular signal appears at the output of the amplifier 12 if the positive and negative saturation voltages of the amplifier 14 are symmetrical and if the signal is zero at the output of the circuit 2. Symmetrical square-wave signals appear at the output of the amplifier 14, again under the same conditions. This operation is in fact concerned with the state in which the control circuit 2 is zero. Now if the amplifier 2 delivers a variable control current to the reversing input terminal of the amplifier 12, the integrating capacitor C is charged and discharged by currents having the respective values $I+I_2$ and $I-I_2$. Since the charge and discharge times are inversely proportional to the current, a dissymmetrical sawtooth signal will appear at the output of the amplifier 12, the cyclic ratio $I/I_2$ of said signal being equal to $t_1-t_2/t_1+t_2$ if $t_1$ and $t_2$ represent the charge and discharge times of the capacitor C. It should be noted that the cyclic ratio can be either positive or negative according to the sign of $I_2$ and that on the other hand, if $I_2$ is larger than $I_1$, the oscillator will be blocked since the polarity of the output of the amplifier 14 is opposite to that of the amplifier 2.

The operation of the switching device as a whole will now be briefly explained. As long as the current, $I_2$ is lower than the threshold of the amplifier 2, this latter is saturated. By means of the oscillating circuit F and the matching circuit G, a logical opening signal is applied to the transistors 42 and 56 whereas the reverse closure signal is applied to the transistors 40 and 58. Throughout this first period, only the current $I_1$ is therefore present at the output D of the entire circuit. When the current $I_2$ becomes higher than the threshold of the amplifier 2, the oscillating circuit F begins to oscillate as shown in FIG. 2. At the commencement of this transitional or intermediate period, the opening times of the transistors 42 and 56 are considerably longer than the opening times of the transistors 40 and 58 as is apparent from FIG. 2. In consequence, signals $I_1$ and $I_2$ are present in alternate sequence at the output D with a preponderance of the signal $I_1$. As time elapses and the signal $I_2$ increases, the opening times of the transistors 40 and 58 increase. In other words, the signal $I_2$ is preponderant with respect to the signal $I_1$ at the output D. When the signal $I_2$ attains a value such that the amplifier 2 is again saturated (second period), the oscillating circuit is again blocked in a position such that the transistors 40 and 58 are continuously open whereas the transistors 56 and 42 are continuously closed. In consequence, the signal $I_2$ is alone present at the output D of the device.

It is noted from FIG. 2 that, at the ends of the intermediate or "switching" period, the pulses are of small width and of low frequency whereas the pulses have a higher density in the central portion of this range but the oscillation frequency of the order of 4 kc/s is sufficiently high to ensure that logarithmic measurement is not disturbed in the measuring device M.

What we claim is:

1. A device for progressive electrical switching for obtaining at the output thereof an electrical output signal having a mean amplitude which changes progressively from the amplitude of a first electrical signal to the amplitude of a second electrical signal, wherein said device comprises: a switch unit constituted essentially by two first switches mounted in parallel, each switch being provided with one input, one output and one control input, one of the signals being applied to each input of said switches, the outputs of said switches being connected to a common output terminal of the device at which said electrical output signal is obtained, a logical control unit for controlling said switching unit in order to produce two logical control signals $S_1$ and $S_2$, one of said signals being applied to each control input of the switching unit, each signal being capable of assuming a first logical level for closing said first switches and a second logical level for opening said first switches, the two signals $S_1$ and $S_2$ being such as to have different logical levels at each instant, said logical control unit being provided with means for giving the first logical level to the signal $S_1$ during a first period and a second logical level to said signal during a second period and for giving to the same signal during an intermediate period between the first and the second periods alternately the first logical level and the second logical level with a predetermined frequency so as to ensure that the successive time durations during which the said signal has the first logical level decrease progressively when passing from the first period to the second period.

2. A device according to claim 1, wherein said logical control unit essentially comprises a double-threshold circuit for receiving one of the electrical signals on one of its inputs, an oscillator and a wave-shaping circuit, the output of said double-threshold circuit being connected to the input of said oscillator, said oscillator being capable of delivering square-topped voltage pulses of constant amplitude and of predetermined frequency and of variable width, said double-threshold circuit being such as to deliver a signal for blocking said oscillator in a first position if the signal applied to the input of the double-threshold circuit is lower than the bottom threshold, a signal for blocking said oscillator in a second position if the signal applied to the input of the double-threshold circuit is higher than the top threshold, and an oscillation signal whose waveform depends on the signal applied to said double-threshold circuit when said signal is between the two thresholds.

3. A device according to claim 1 or claim 2, wherein the switching unit further comprises two second switches, each second switch being mounted between the input of one of the first switches and ground, each second switch aforesaid being controlled by the signal applied to the control input of the first switch associated with the other second switch.

4. A device according to claim 3, wherein the four switches are constituted by field-effect transistors in which the input gate constitutes the control input.

* * * * *